US009007392B2

(12) United States Patent
Chen et al.

(10) Patent No.: US 9,007,392 B2
(45) Date of Patent: Apr. 14, 2015

(54) METHOD FOR ENHANCING CONTRAST OF COLOR IMAGE DISPLAYED ON DISPLAY SYSTEM AND IMAGE PROCESSING SYSTEM UTILIZING THE SAME

(71) Applicant: Chunghwa Picture Tubes, Ltd., Bade, Taoyuan (TW)

(72) Inventors: Jian-rong Chen, Taoyuan (TW); Chun-chieh Chiu, Luzhu Township, Taoyuan County (TW)

(73) Assignee: Chunghwa Picture Tubes, Ltd., Bade, Taoyuan (TW)

( * ) Notice: Subject to any disclaimer, the term of this patent is extended or adjusted under 35 U.S.C. 154(b) by 245 days.

(21) Appl. No.: 13/870,481

(22) Filed: Apr. 25, 2013

(65) Prior Publication Data

US 2014/0125688 A1 May 8, 2014

(30) Foreign Application Priority Data

Nov. 5, 2012 (TW) ............................ 101141024 A

(51) Int. Cl.

| | |
|---|---|
| ***G09G 5/00*** | (2006.01) |
| ***G09G 5/02*** | (2006.01) |
| ***G09G 5/10*** | (2006.01) |
| ***H04N 5/202*** | (2006.01) |
| ***H04N 5/21*** | (2006.01) |
| ***H04N 5/14*** | (2006.01) |
| ***G06K 9/40*** | (2006.01) |
| ***G06K 9/36*** | (2006.01) |
| ***G06K 9/00*** | (2006.01) |
| ***G03F 3/08*** | (2006.01) |
| ***H04N 1/46*** | (2006.01) |

(52) U.S. Cl.
CPC .......... *G09G 5/02* (2013.01); *G09G 2320/0666* (2013.01); *G09G 2320/0673* (2013.01)

(58) Field of Classification Search
USPC ................. 345/581, 589–590, 600, 605–606, 345/617–619, 639, 643, 204, 690, 692; 348/254–256, 557, 630, 671–674; 358/518–520, 522, 525; 382/162, 382/166–169, 254, 274, 276
See application file for complete search history.

(56) References Cited

U.S. PATENT DOCUMENTS

| | | | | |
|---|---|---|---|---|
| 5,768,432 | A * | 6/1998 | Schweid | 382/237 |
| 6,463,172 | B1 | 10/2002 | Yoshimura | |
| 7,155,060 | B2 | 12/2006 | Kuwata | |
| 2005/0212736 | A1 * | 9/2005 | Lu et al. | 345/87 |
| 2007/0065008 | A1 | 3/2007 | Kao et al. | |
| 2008/0199074 | A1 * | 8/2008 | Mitsunaga | 382/169 |
| 2008/0285853 | A1 * | 11/2008 | Bressan | 382/169 |
| 2011/0116713 | A1 * | 5/2011 | Zeng et al. | 382/167 |
| 2012/0056910 | A1 | 3/2012 | Safaee-Rad et al. | |

FOREIGN PATENT DOCUMENTS

| | | |
|---|---|---|
| CN | 101221659 A | 7/2008 |
| CN | 101325035 A | 12/2008 |
| TW | 200714086 | 4/2007 |

* cited by examiner

*Primary Examiner* — Wesner Sajous
(74) *Attorney, Agent, or Firm* — Lowe Hauptman & Ham, LLP

(57) ABSTRACT

The present invention provides a method for enhancing contrast of a color image displayed on a display system and an image processing system utilizing the same. In the present invention, the gray values of R, G, and B components of one color image are separately counted during processing the image. When calculating the corresponding output values for the gray values of R, G, and B components in each pixel, they are adapted to ratios between the gray values of R, G, and B components. Therefore, the present invention can effectively maintain the color distribution for a considerable degree and greatly enhance the image contrast.

9 Claims, 12 Drawing Sheets

METHOD FOR ENHANCING CONTRAST OF COLOR IMAGE DISPLAYED ON DISPLAY SYSTEM AND IMAGE PROCESSING SYSTEM UTILIZING THE SAME

CROSS-REFERENCE TO RELATED APPLICATION

This application claims priority from and the benefit under 35 U.S.C. §119(a) of Taiwanese Patent Application No. 101141024, filed on Nov. 5, 2012 in the TIPO (Taiwan Intellectual Property Office), which is hereby incorporated by reference for all purposes as if fully set forth herein.

TECHNICAL FIELD OF THE INVENTION

The present invention relates to an image displaying technique, and more particularly, to a method for enhancing contrast of a color image displayed on a display system, and an image processing system utilizing the same.

BACKGROUND OF THE INVENTION

As the display technology is improving day by day, consumers demand higher and higher image quality of displaying systems such as liquid crystal displays, smart TVs, and a tablet PCs. Among many approaches, enhancing image contrast is a way to improve the image quality.

To make images displayed on a display more colorful, image data of one frame are usually analyzed by statistics and processed to be a histogram. As shown in FIG. 1, the numbers of gray values of R, G, and B components falling into respective intervals are counted for all the pixels in that frame. Next, a transformation curve is created as shown in FIG. 2. The use of the transformation curve is to increase a distributed range of gray values to be presented or displayed on a screen when the number of these gray values falling into some particular interval is large. After the transformation, each gray value in every pixel for that frame will map to another value via a one-to-one mapping and then output to a display panel.

However, the afore-described approach is to pool the gray values of red (R) component, green (G) component, and blue (B) component of one image frame all together and then create the transformation curve. For some particular frame that has great color distribution difference, pooling the gray values of R, G, and B components all together will homogenize the overall distribution. This makes the ratio of input to output become almost 1:1, thereby unable to enhance the image contrast effectively. As shown in FIGS. 3A to 3C, these figures respectively show the quantity distribution of the gray values of R, G, and B components in respective intervals for a single image frame. FIG. 4A illustrates that the gray values of R, G, and B components of this frame are pooled all together. It can be known that the overall distribution is much unvaried or even such that the slop of transformation curve approximately becomes 1, as shown in FIG. 4B. That is, the input value is almost equal to the output value, thereby unable to improve the contrast effectively.

Therefore, there is a need to provide a novel method capable of enhancing the image contrast, for avoiding the above described drawbacks of conventional skills.

SUMMARY OF THE INVENTION

An objective of the present invention is to provide a method for enhancing contrast of a color image displayed on a display system and an image processing system utilizing the same, for enhancing image contrast effectively.

To achieve the above objective, the present invention provides a method for enhancing contrast of a color image displayed on a display system, said method comprising steps of: A. providing the color image, which has a plurality of pixels, each pixel having gray values of primaries including red, green, and blue; B. respectively measuring quantity distribution of the gray values of red component, the gray values of green component, and the gray values of blue component for all the pixels in the color image; C. computing respective transformation curves for the gray values of red component, the gray values of green component, and the gray values of blue component for all the pixels according to the quantity distribution measured in Step B; and D. calculating a corresponding output value for the gray value of red component in one of the pixels according to transformed values obtained by introducing the gray value of red component of said pixel into the respective transformation curves and weighting coefficients respectively corresponding to the transformed values, calculating a corresponding output value for the gray value of green component of said pixel according to transformed values obtained by introducing the gray value of green component of said pixel into the respective transformation curves and weighting coefficients respectively corresponding to the transformed values, calculating a corresponding output value for the gray value of blue component of said pixel according to transformed values obtained by introducing the gray value of blue component of said pixel into the respective transformation curves and weighting coefficients respectively corresponding to the transformed values.

In another aspect, the present invention provides an image processing system, receiving a signal of a color image, which has a plurality of pixels, each pixel having gray values of primaries including red, green, and blue, said system comprising: an image statistical module, for respectively measuring quantity distribution of the gray values of red component, the gray values of green component, and the gray values of blue component for all the pixels in the color image; a transformation curve computing module, for computing respective transformation curves for the gray values of red component, the gray values of green component, and the gray values of blue components for all the pixels according to the quantity distribution measured by the image statistical module; a weightings calculating module, for calculating weighting coefficients whose denominators all are a sum of the gray value of red component, the gray value of green component, and the gray value of blue component for one of the pixels and whose numerators respectively are the gray value of red component, the gray value of green component, and the gray value of blue component of said pixel; and an output value calculating module coupled to the weightings calculating module, for calculating a corresponding output value for the gray value of red component of said pixel according to transformed values obtained by introducing the gray value of red component of said pixel into the respective transformation curves and the weighting coefficients respectively corresponding to the transformed values, calculating a corresponding output value for the gray value of green component of said pixel according to transformed values obtained by introducing the gray value of green component of said pixel into the respective transformation curves and the weighting coefficients respectively corresponding to the transformed values, calculating a corresponding output value for the gray value of blue component of said pixel according to transformed values obtained by introducing the gray value blue component of said pixel into the respective transformation curves and the weighting coefficients respectively corresponding to the transformed values.

In the present invention, the gray values of R, G, and B components of one color image are separately counted during processing the image. When calculating the corresponding output values for the gray values of R, G, and B components in each pixel, they are adapted to ratios between the gray values of R, G, and B components. Therefore, the present invention can effectively maintain the color distribution for a considerable degree and greatly enhance the image contrast, making the output image more bright in color and beautiful.

DETAILED DESCRIPTION OF THE INVENTION

Figure 1:
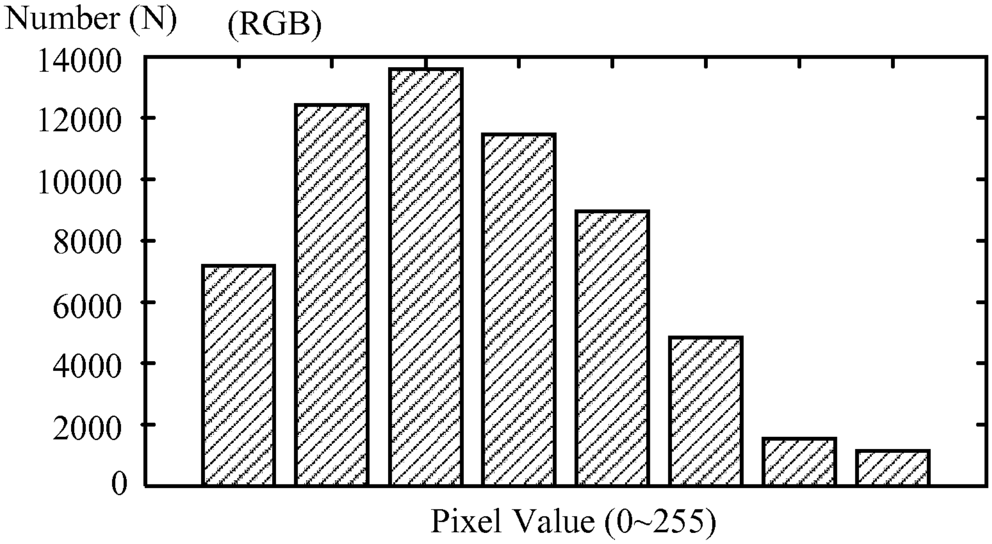
FIG. 1 (Prior Art)
FIG. 1 is a histogram of a color image.
Figure 2:
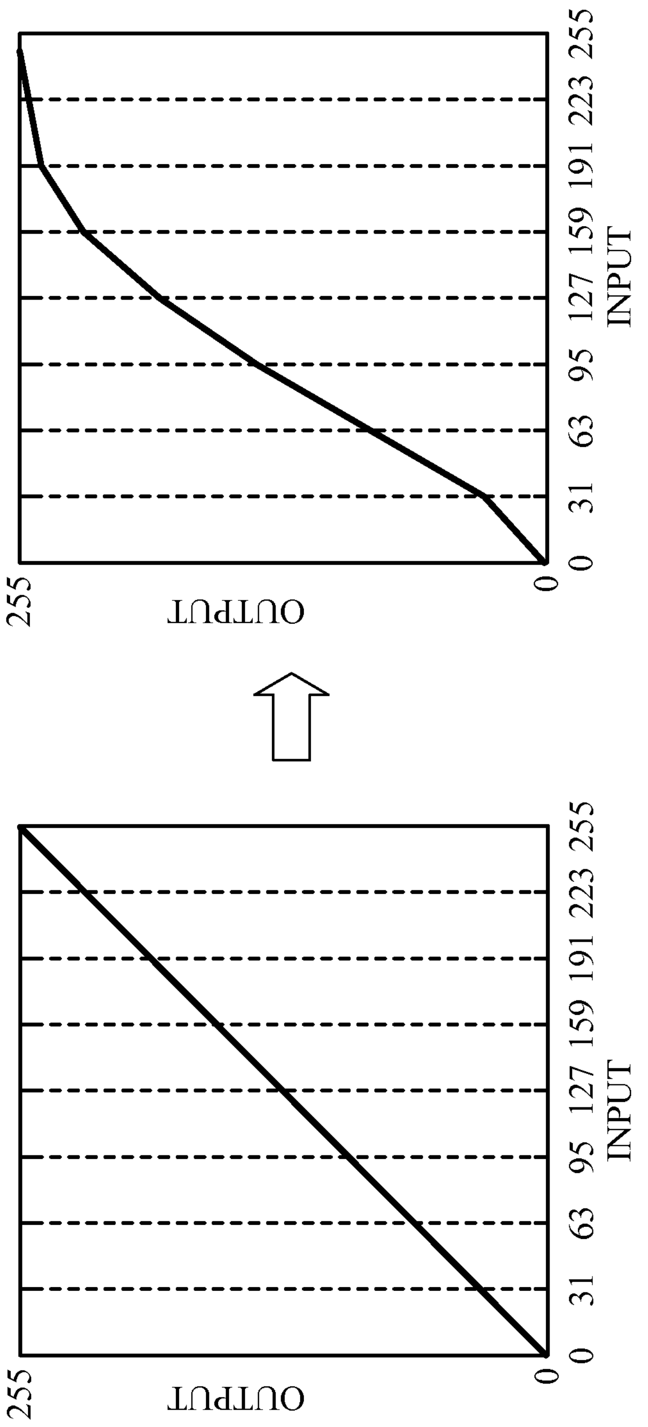
FIG. 2 (Prior Art)
FIG. 2 is a schematic diagram showing a transformation curve established according to a histogram.
Figure 3C:
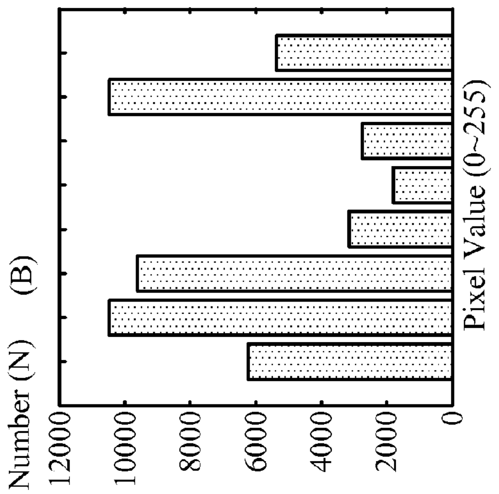
FIG. 3C (Prior Art)
FIG. 3C is a diagram showing quantity distribution of gray values of blue component in that image frame.
Figure 3B:
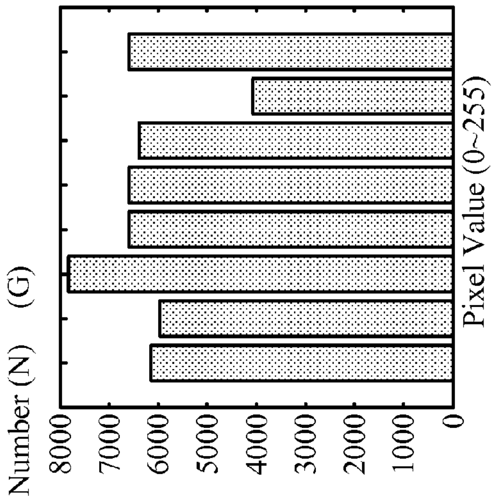
FIG. 3B (Prior Art)
FIG. 3B is a diagram showing quantity distribution of gray values of green component in that image frame.
Figure 3A:
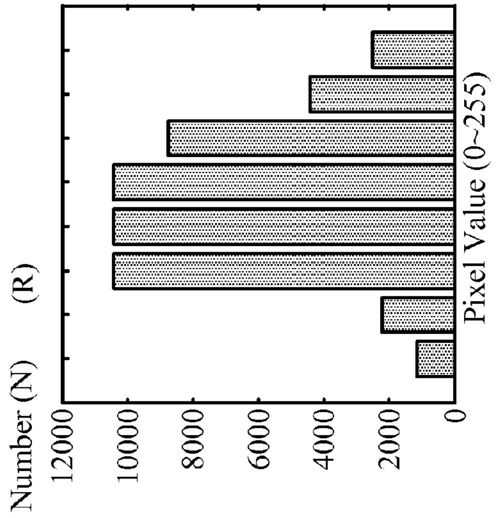
FIG. 3A (Prior Art)
FIG. 3A is a diagram showing quantity distribution of gray values of red component in one image frame.
Figure 4B:
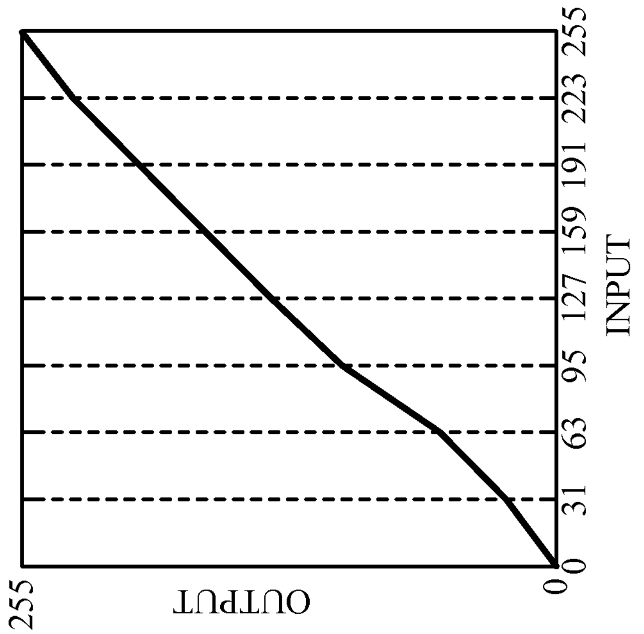
FIG. 4B (Prior Art)
FIG. 4B is a diagram showing a transformation curve established by pooling the gray values of red, green, and blue components all together.
Figure 4A:
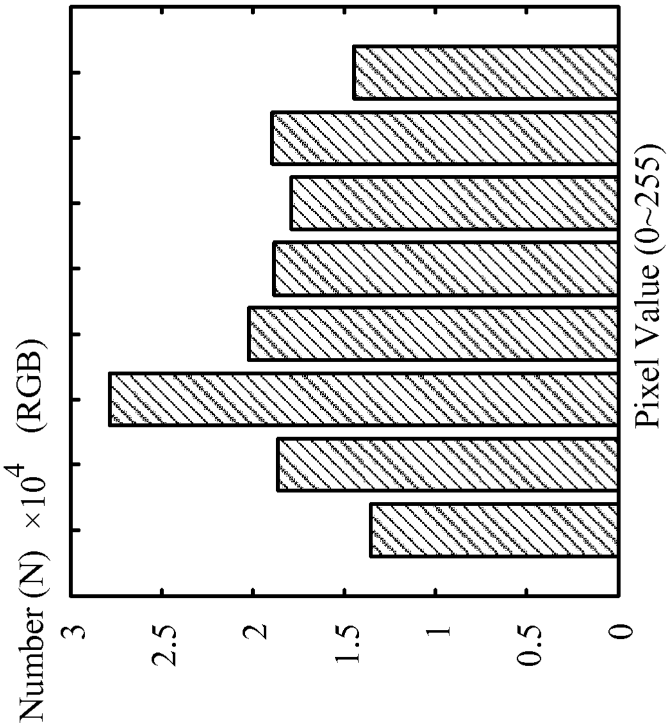
FIG. 4A (Prior Art)
FIG. 4A is a histogram established by pooling the gray values of red, green, and blue components all together.
Figure 5:
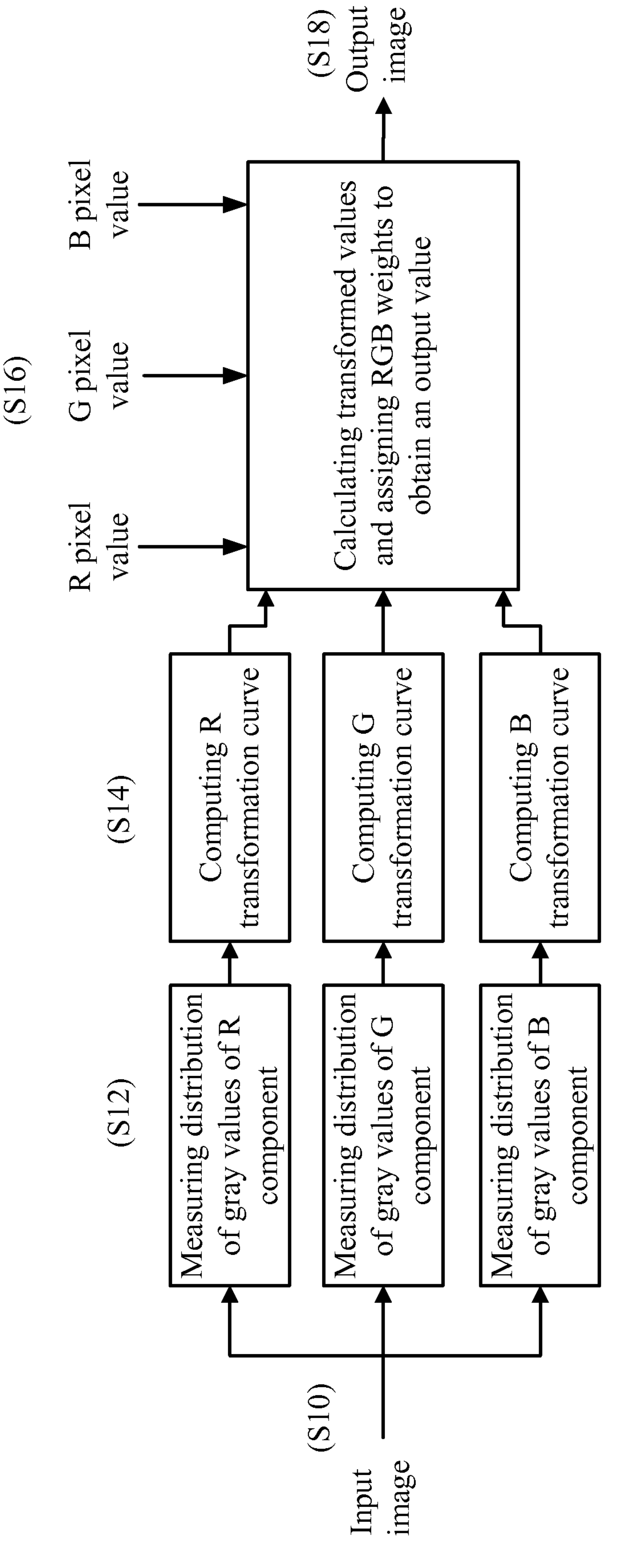
FIG. 5 is a flow chart of a method for enhancing contrast of a color image according to the present invention.

The present method for enhancing contrast of an image is applicable to a color image displayed on a display system. In the present invention, the image is firstly processed by an image processing technique for improving its contrast, and then the display system displays the processed image. FIG. 5 is a flow chart of a method for enhancing contrast of a color image according to the present invention. The color image contrast enhancing method of the present invention will be detailed by the following description in conjunction with FIG. 5.

Step S10: the color image to be displayed on a screen is firstly inputted. For example, the color image may come from a computer and be transmitted via a video interface. Generally, the color image has a plurality of pixels and each pixel has gray values of primaries including red (R), green (G), and blue (B). For example, the gray values for each primary color are ranged from 0 to 255.

Step S12: quantity distribution of the gray values of red (R) component, the gray values of green (G) component, and the gray values of blue (B) component for all the pixels in this color image is respectively measured. More specifically, the numbers of the gray values of red component failing into respective intervals are counted for all the pixels in the color image (e.g., the histogram shown in FIG. 6A), the numbers of the gray values of green component failing into respective intervals are counted for all the pixels in the color image (e.g., the histogram shown in FIG. 6B), and the numbers of the gray values of blue component failing into respective intervals are counted for all the pixels in the color image (e.g., the histogram shown in FIG. 6C). In this step, the gray values of R, G, and B components of the same image are counted individually, instead of pooling the gray values of R, G, and B components together.

Figure 6A:
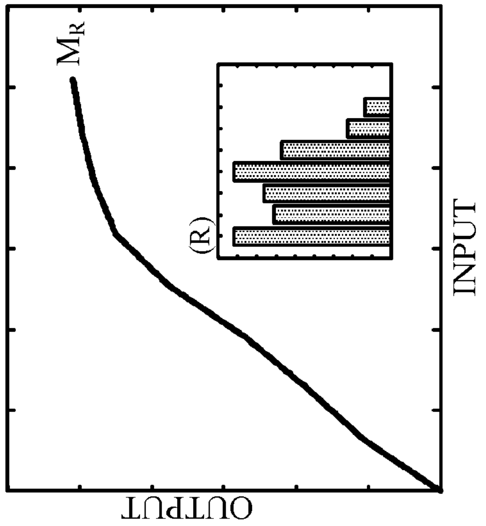
FIG. 6A is a diagram showing quantity distribution of gray values of red component in one image and a transformation curve corresponding thereto.
Figure 6B:
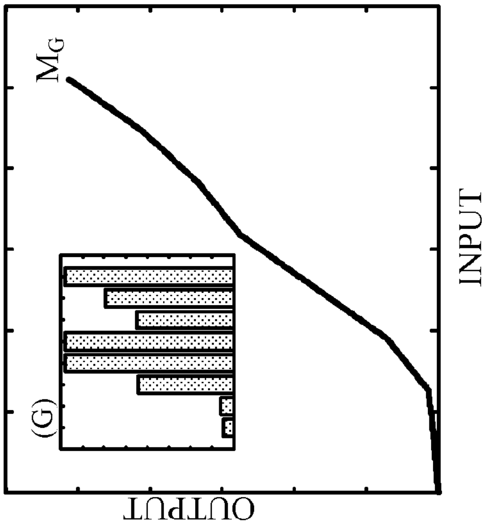
FIG. 6B is a diagram showing quantity distribution of gray values of green component in that image and a transformation curve corresponding thereto.
Figure 6C:
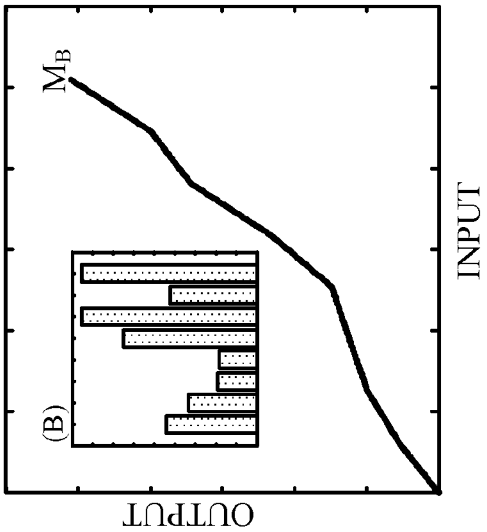
FIG. 6C is a diagram showing quantity distribution of gray values of blue component in that image and a transformation curve corresponding thereto.

Step S14: respective transformation curves for the gray values of red component, the gray values of green component, and the gray values of blue component for all the pixels are computed according to the quantity distribution measured in Step S12. As shown in FIGS. 6A to 6C, the transformation curve MR corresponds to the gray values of red component, the transformation curve MG corresponds to the gray values of green component, and the transformation curve MB corresponds to the gray values of blue component. The transformation curves are obtained based on: when the gray values are greatly distributed, increasing its range for presentation. That is, when the number of the gray values of R, G, or B component falling into some particular interval is large, the distribution of theses gray values becomes wider, greater than the original interval after transformed via the transformation curve. After the transformation, each gray value of R, G, or B component of the pixels will map to another value via a one-to-one mapping.

Figure 7C:
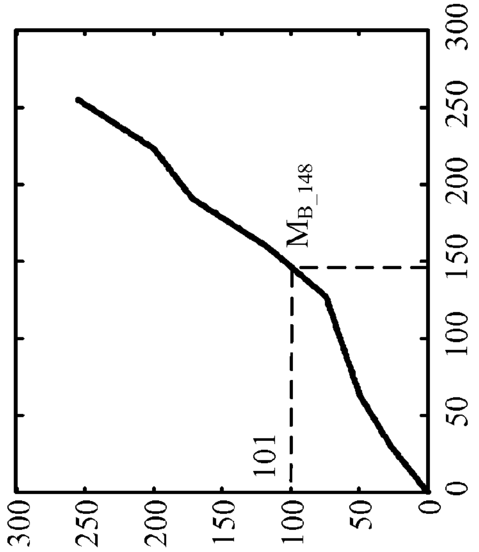
FIG. 7C is a schematic diagram showing a transformed value obtained by substituting a gray value in one pixel into the transformation curve of FIG. 6C.
Figure 7B:
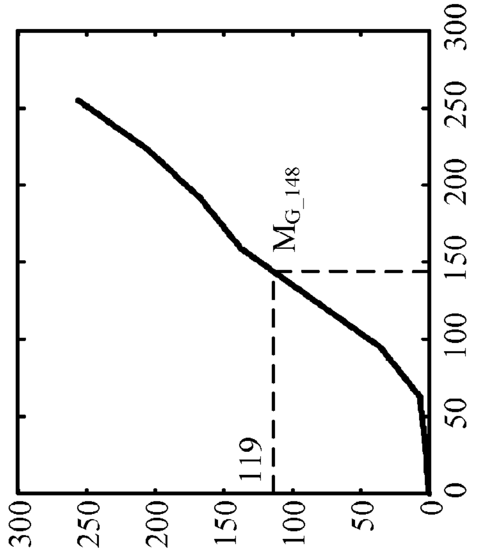
FIG. 7B is a schematic diagram showing a transformed value obtained by substituting a gray value in one pixel into the transformation curve of FIG. 6B.
Figure 7A:
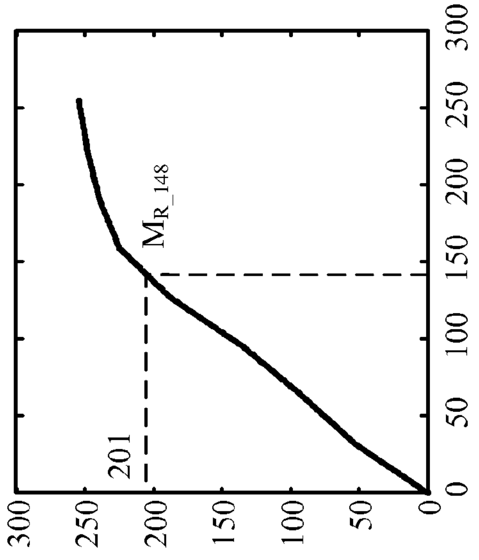
FIG. 7A is a schematic diagram showing a transformed value obtained by substituting a gray value in one pixel into the transformation curve of FIG. 6A.

Step S16: taking one specific pixel in the color image for example, the first is to introduce the gray value of red component of said pixel to the respective transformation curves to obtain transformed values (as shown in FIGS. 7A to 7C) and the second is to assign weighting coefficients to these transformed values so as to figure out a corresponding output value of the gray value of red component of said pixel. The weighting coefficients are ratios of the respective gray values to all of the gray values in said pixel. That is, the denominators all are a sum of the gray value of red component, the gray value of green component, and the gray value of blue component of said pixel, and the numerators respectively are the gray value of red component, the gray value of green component, and the gray value of blue component of said pixel. For the corresponding output value of the gray value of red component of said pixel, it can be calculated by the following Equation (1).

$$M\_r = \frac{R}{R+G+B} \times MR\_r + \frac{G}{R+G+B} \times MG\_r + \frac{B}{R+G+B} \times MB\_r, \quad (1)$$

where M_r is the corresponding output value of the gray value of red component of said pixel, R, G, and B respectively are the gray value of red component, the gray value of green component, and the gray value of blue component of said pixel, $$\frac{R}{R+G+B}, \frac{G}{R+G+B}, \text{ and } \frac{B}{R+G+B}$$

are the weighting coefficients, MR_r is the transformed value obtained by introducing the gray value of red component of said pixel into a red transformation curve, MG_r is the transformed value obtained by introducing the gray value of red component of said pixel into a green transformation curve, and MB_r is the transformed value obtained by introducing the gray value of red component of said pixel into a blue transformation curve.

Similarly, the corresponding output values of the gray value of green component and the gray value of blue component of said pixel can be calculated respectively by the following Equations (2) and (3).

$$M\_g = \frac{R}{R+G+B} \times MR\_g + \frac{G}{R+G+B} \times MG\_g + \frac{B}{R+G+B} \times MB\_g, \quad (2)$$

$$M\_b = \frac{R}{R+G+B} \times MR\_b + \frac{G}{R+G+B} \times MG\_b + \frac{B}{R+G+B} \times MB\_b, \quad (3)$$

After that, all the pixels of the color image are processed according to aforesaid manner so as to obtain output values corresponding to the gray values of R, G, and B components for all the pixels.

Step S18: the corresponding output values of the gray values R, G, and B components for all the pixels from Step S16 are outputted to a display panel, and thereby an image with contrast improved is shown or presented on the screen.

Two concrete examples are illustrated below for the calculation of output values in Step S16. Assume that the gray values of R, G, and B component of a given pixel in a color image are R=0, G=71, and B=148. Taking the gray value of blue component B=148 as an input value, the value 148 is transformed via the respective transformation curves according to aforesaid manner so as to obtain transformed values, and then weighting coefficients are assigned to the transformed values. The output value corresponding to the input value B=148 is M__148=(0/(0+71+148))×MR__148+(71/(0+71+148))×MG__148+(148/(0+71+148))×MB__148. As shown in FIGS. 7A to 7C, the transformed values MR__148, MG__148, and MB__148 respectively are 201, 119, and 101. Therefore, the output value corresponding to the gray value of blue component B=148 is M__148=108. The output values corresponding to other gray values R=0, G=71 of the same pixel can be calculated by similar manner.

In addition, assume that the gray values of R, G, and B components of a given pixel in a color image are R=54, G=106, and B=0. Taking the gray value of green component G=106 as an input value, the value 106 is transformed via the respective transformation curves according to aforesaid manner so as to obtain transformed values, and then weighting coefficients are assigned to the transformed values. The output value corresponding to the input value G=106 is M__106=(54/(54+106+0))×MR__106+(106/(54+106+0))×MG__106+(0/(54+106+0))×MB__106. If the transformed values MR__106, MG__106, and MB__106 respectively are 150, 53, and 66. Accordingly, the output value corresponding to the gray value of green component G=106 is M__106=85. The output values corresponding to other gray values R=54, B=0 of the same pixel can be calculated by similar manner.

Figure 8:
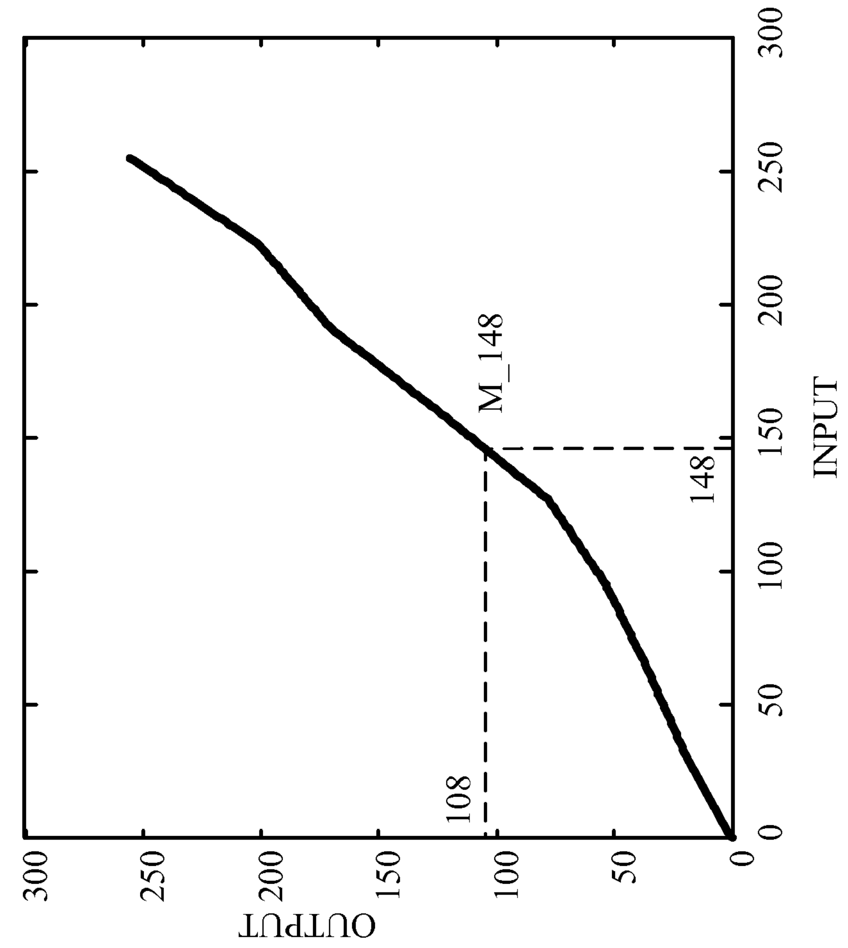
FIG. 8 is a diagram showing a synthetic transformation curve corresponding to a pixel.

The R, G, and B transformation curves for some particular pixel in the color image as shown in FIGS. 6A to 6C are synthesized by incorporating the weighting coefficients such that a synthetic transformation curve shown in FIG. 8 is obtained for this pixel. That is, the synthetic transformation curve may be obtained by multiplying the R, G, and B transformation curves by the respective weighting coefficients with respect to this single pixel and then adding them up. The corresponding output values of the gray values of R, G, and B components of this pixel can be obtained by directly looking up the synthetic transformation curve. That is, in one image, each pixel has its own corresponding synthetic transformation curve. This can improve image contrast in consideration of the differences between the respective pixels, and thereby avoiding homogenizing the gray values in the case of pooling the gray values of R, G, and B components together.

In the present invention, the gray values of R, G and B components of one color image are separately counted during processing the image. When calculating the corresponding output values of the gray values of R, G, and B components in each pixel, they are adapted to ratios between the gray values of R, G, and B components. Therefore, the present invention can effectively maintain the color distribution for a considerable degree and greatly enhance the image contrast, making the output image more bright in color and beautiful.

Figure 9:
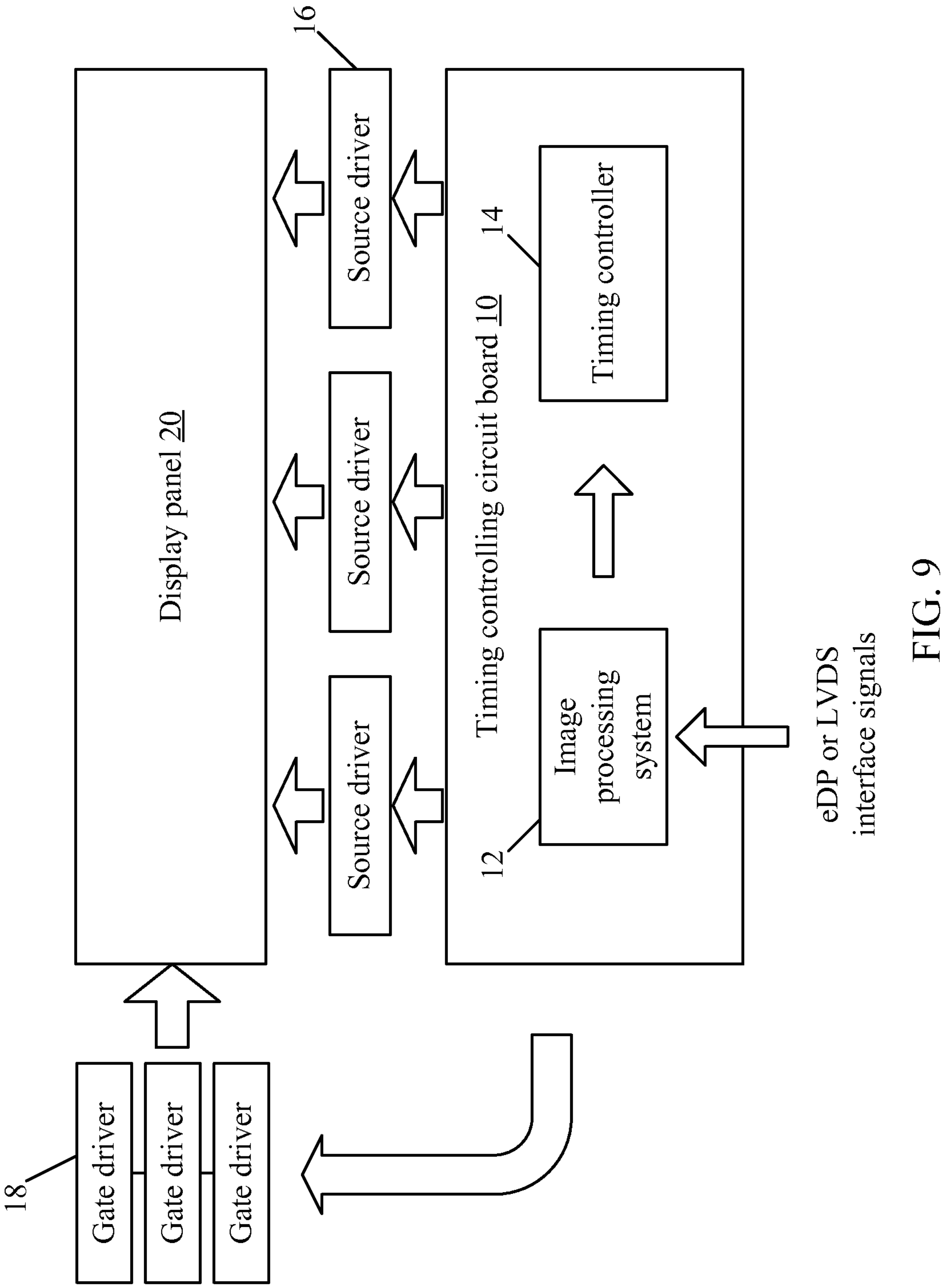
FIG. 9 is a block diagram showing a display system according to the present invention.
Figure 10:
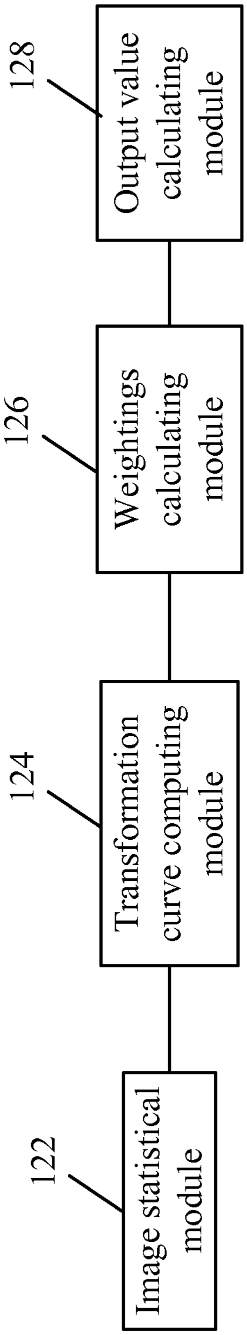
FIG. 10 is a block diagram showing an image processing system on a display system according to the present invention.

Please refer to FIG. 9 and FIG. 10, which are schematic diagrams respectively showing a display system and an image processing system in the display system according to the present invention. As shown in FIG. 9, the display, system of the present invention comprises an image processing system 12, a timing controller 14, source drivers 16, gate drivers 18, and a display panel 20. The image processing system 12 can receive image signals via an embedded display port (eDP) or a low-voltage differential signaling (LVDS) interface. For example, the image signals may come from a computer. The image processing system 12 processes the original images from a video interface by using an image processing technique for enhancing their contrast. The processed images are then transmitted to the timing controller 14. The timing controller 14 on a timing controlling circuit board 10 controls the gate drivers 18 with a scan timing and controls the source drivers 16 with a timing for inputting the processed image data to the display panel 20. Then, the display panel 20 displays the processed images on a screen.

As shown in FIG. 10, the image processing system 12 comprises an image statistical module 122, a transformation curve computing module 124, a weightings calculating module 126, and an output value calculating module 128. The image statistical module 12 respectively measures quantity distribution of the gray values of red component, the gray values of green component, and the gray values of blue component for all the pixels in one color image (see the histograms shown in FIGS. 6A to 6C). The transformation curve computing module 124 is coupled to the image statistical module 122, and is used to compute respective transformation curves for the gray values of red component, the gray values of green component, and the gray value of blue components for all the pixels according to the quantity distribution measured by the image statistical module 122 (see the transformation curves MR, MG, and MB shown in FIGS. 6A to 6C). The weightings calculating module 126 calculates weighting coefficients for each pixel. The denominators thereof are a sum of the gray value of red component, the gray value of green component, and the gray value of blue component for a particular pixel and the numerators thereof respectively are the gray value of red component, the gray value of green component, and the gray value of blue component of said pixel. That is, the weighting coefficients are represented by $$\frac{R}{R+G+B},\ \frac{G}{R+G+B},\ \text{and}\ \frac{B}{R+G+B}.$$

The output value calculating module 128 is coupled to the weightings calculating module 126, and is used to calculate a corresponding output value for the gray value of red component of one pixel according to transformed values obtained by introducing the gray value of red component of said pixel into the respective transformation curves and the weighting coefficients respectively corresponding to the transformed values. Then, the corresponding output values for the gray value of green component and the gray value of blue component of said pixel are calculated by similar manner. For example, the output values corresponding to the respective gray values of one pixel can be calculated by using the above equations (1), (2), and (3) and in such a manner that all the pixels in the color image are processed. The functions of the image statistical module 122, the transformation curve computing module 124, the weightings calculating module 126, and the output value calculating module 128 in the image processing system 12 of the present invention can be referred to the description pertaining to Steps S12 to S16, and it is not repeated again.

Figure 11:
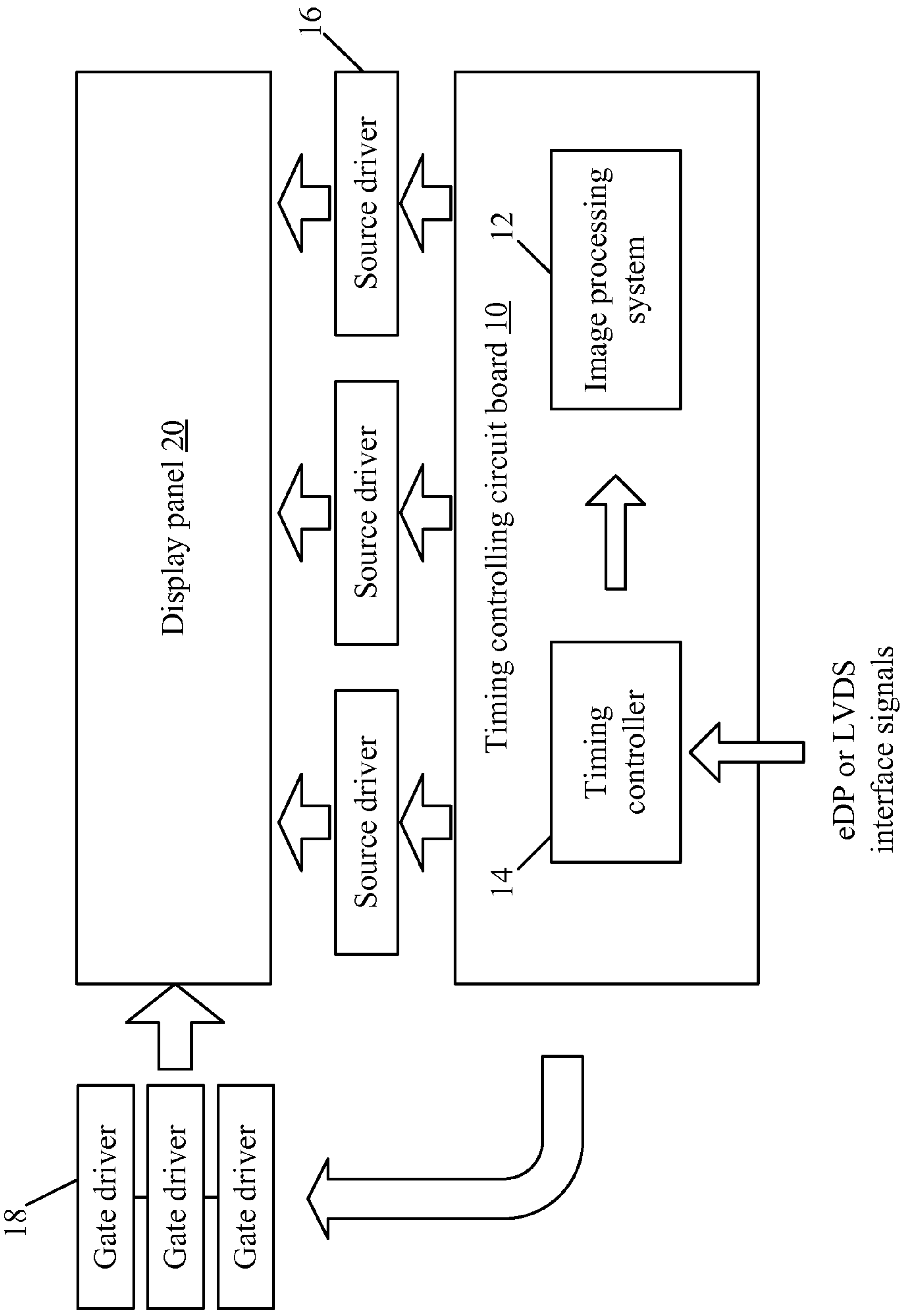
FIG. 11 is a block diagram showing another display system according to the present invention.
Figure 12:
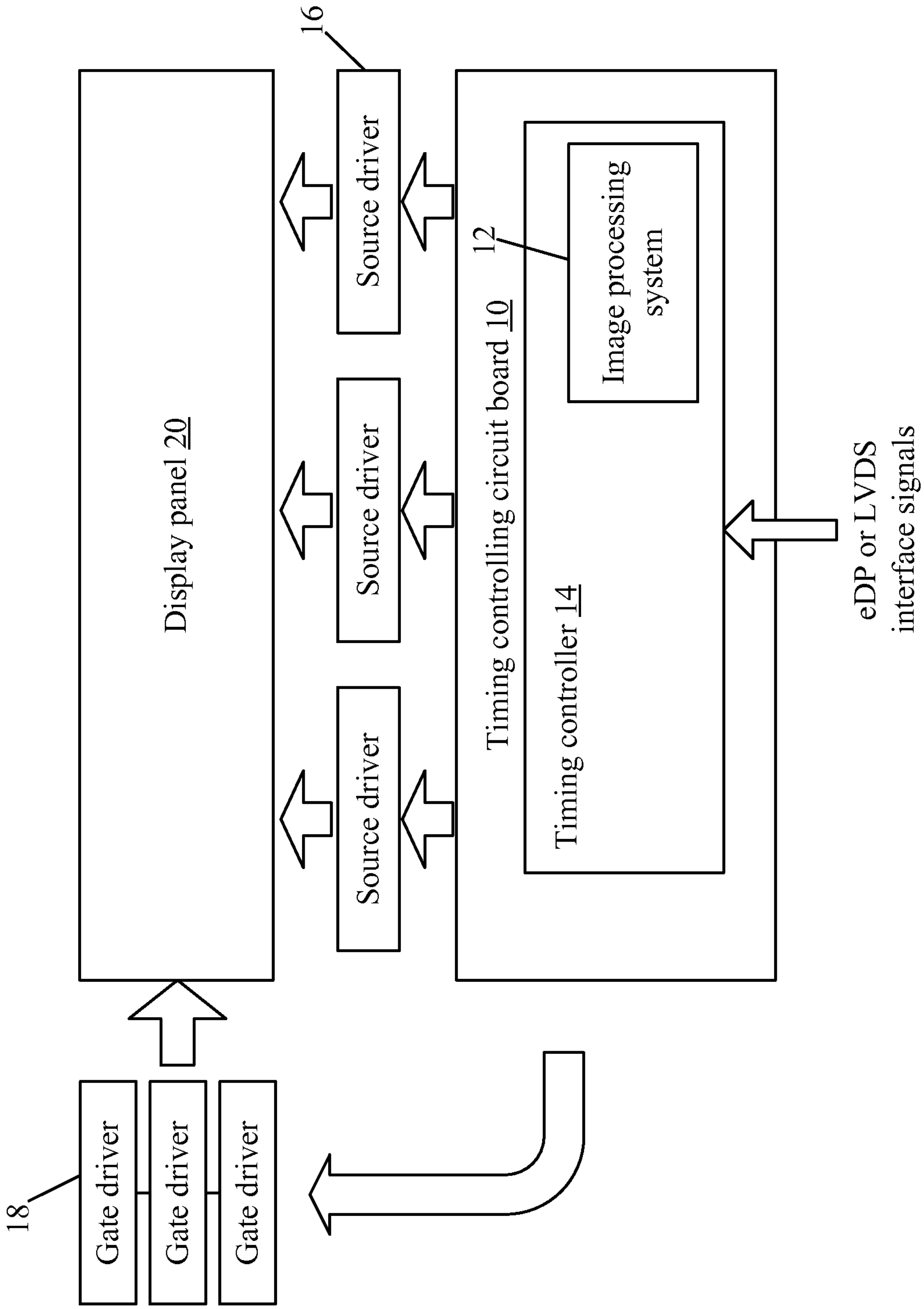
FIG. 12 is a block diagram showing still another display system according to the present invention.

As shown in FIG. 11 and FIG. 12, the image processing system 12 can be arranged after timing controller 14 as a back end, or be integrated into the timing controller 14. Alternatively, the image processing system 12 is integrated into a video card or a display chip.

While the preferred embodiments of the present invention have been illustrated and described in detail, various modifications and alterations can be made by persons skilled in this art. The embodiment of the present invention is therefore described in an illustrative but not restrictive sense. It is intended that the present invention should not be limited to the particular forms as illustrated, and that all modifications and alterations which maintain the spirit and realm of the present invention are within the scope as defined in the appended claims.

What is claimed is:

1. A method for enhancing contrast of a color image displayed on a display system, said method comprising steps of:

A. providing the color image, which has a plurality of pixels, each pixel having gray values of primaries including red, green, and blue;

B. respectively measuring quantity distribution of the gray values of red component, the gray values of green component, and the gray values of blue component for all the pixels in the color image;

C. computing respective transformation curves for the gray values of red component, the gray values of green component, and the gray values of blue component for all the pixels according to the quantity distribution measured in Step B; and D. calculating a corresponding output value for the gray value of red component in one of the pixels according to transformed values obtained by introducing the gray value of red component of said pixel into the respective transformation curves and weighting coefficients respectively corresponding to the transformed values, calculating a corresponding output value for the gray value of green component of said pixel according to transformed values obtained by introducing the gray value of green component of said pixel into the respective transformation curves and weighting coefficients respectively corresponding to the transformed values, calculating a corresponding output value for the gray value of blue component of said pixel according to transformed values obtained by introducing the gray value of blue component of said pixel into the respective transformation curves and weighting coefficients respectively corresponding to the transformed values.

2. The method according to claim 1, wherein the Step B is to count the numbers of the gray values of red component failing into respective intervals for all the pixels in the color image, count the numbers of the gray values of green component failing into respective intervals for all the pixels in the color image, and count the numbers of the gray values of blue component failing into respective intervals for all the pixels in the color image.

3. The method according to claim 1, wherein the Step C is to figure out the transformation curves based on:

when the gray values are greatly distributed, increasing its range for presentation.

4. The method according to claim 1, wherein the weighting coefficients in Step D are fractions whose denominators all are a sum of the gray value of red component, the gray value of green component, and the gray value of the blue component of said pixel, and whose numerators respectively are the gray value of red component, the gray value of green component, and the gray value of blue component of said pixel.

5. The method according to claim 4, wherein the corresponding output value of the gray value of red component in Step D is calculated by the following equation:

$$\text{M\_r} = \frac{R}{R+G+B}\times\text{MR\_r} + \frac{G}{R+G+B}\times\text{MG\_r} + \frac{B}{R+G+B}\times\text{MB\_r},$$

where M_r is the corresponding output value of the gray value of red component of said pixel, R, G, and B respectively are the gray value of red component, the gray value of green component, and the gray value of blue component of said pixel, $$\frac{R}{R+G+B},\ \frac{G}{R+G+B},\ \text{and}\ \frac{B}{R+G+B}$$

are the weighting coefficients, MR_r is the transformed value obtained by introducing the gray value of red component of said pixel into a red transformation curve, MG_r is the transformed value obtained by introducing the gray value of red component of said pixel into a green transformation curve, and MB_r is the transformed value obtained by introducing the gray value of red component of said pixel into a blue transformation curve.

6. An image processing system, receiving a signal of a color image, which has a plurality of pixels, each pixel having gray values of primaries including red, green, and blue, said system comprising:

an image statistical module, for respectively measuring quantity distribution of the gray values of red component, the gray values of green component, and the gray values of blue component for all the pixels in the color image;

a transformation curve computing module, for computing respective transformation curves for the gray values of red component, the gray values of green component, and the gray values of blue components for all the pixels according to the quantity distribution measured by the image statistical module;

a weightings calculating module, for calculating weighting coefficients whose denominators all are a sum of the gray value of red component, the gray value of green component, and the gray value of blue component for one of the pixels and whose numerators respectively are the gray value of red component, the gray value of green component, and the gray value of blue component of said pixel; and an output value calculating module coupled to the weightings calculating module, for calculating a corresponding output value for the gray value of red component of said pixel according to transformed values obtained by introducing the gray value of red component of said pixel into the respective transformation curves and the weighting coefficients respectively corresponding to the transformed values, calculating a corresponding output value for the gray value of green component of said pixel according to transformed values obtained by introducing the gray value of green component of said pixel into the respective transformation curves and the weighting coefficients respectively corresponding to the transformed values, calculating a corresponding output value for the gray value of blue component of said pixel according to transformed values obtained by introducing the gray value blue component of said pixel into the respective transformation curves and the weighting coefficients respectively corresponding to the transformed values.

7. The system according to claim 6, wherein the image statistical module is to count the numbers of the gay values of red component failing into respective intervals for all the pixels in the color image, count the numbers of the gray values of green component failing into respective intervals for all the pixels in the color image, and count the numbers of the gray values of blue component failing into respective intervals for all the pixels in the color image.

8. The system according to claim 6, wherein the transformation curve computing module is to figure out the transformation curves based on:

when the gray values are greatly distributed, increasing its range for presentation.

9. The system according to claim 6, wherein the output value calculating module is to calculate the corresponding output value of the gray value of red component by the following equation:

$$M\_r = \frac{R}{R+G+B} \times MR\_r + \frac{G}{R+G+B} \times MG\_r + \frac{B}{R+G+B} \times MB\_r,$$

where M_r is the corresponding output value of the gray value of red component of said pixel, R, G, and B respectively are the gray value of red component, the gray value of green component, and the gray value of blue component of said pixel, $$\frac{R}{R+G+B}, \frac{G}{R+G+B}, \text{ and } \frac{B}{R+G+B}$$

are the weighting coefficients, MR_r is the transformed value obtained by introducing the gray value of red component of said pixel into a red transformation curve, MG_r is the transformed value obtained by introducing the gray value of red component of said pixel into a green transformation curve, and MB_r is the transformed value obtained by introducing the gray value of red component of said pixel into a blue transformation curve.

* * * * *